United States Patent [19]
Birritella et al.

[11] Patent Number: 4,571,817
[45] Date of Patent: Feb. 25, 1986

[54] METHOD OF MAKING CLOSELY SPACED CONTACTS TO PN-JUNCTION USING STACKED POLYSILICON LAYERS, DIFFERENTIAL ETCHING AND ION IMPLANTATIONS

[75] Inventors: Mark S. Birritella, Phoenix; Kevin McLaughlin, Chandler, both of Ariz.

[73] Assignee: Motorola, Inc., Schaumburg, Ill.

[21] Appl. No.: 712,041

[22] Filed: Mar. 15, 1985

[51] Int. Cl.$^4$ ............... H01L 21/225; H01L 21/265; H01L 21/308

[52] U.S. Cl. .................... 29/576 B; 29/578; 29/591; 148/1.5; 148/175; 148/187; 148/DIG. 10; 357/34; 357/91

[58] Field of Search ............ 29/576 B, 578, 591; 148/1.5, 175, 187; 357/34, 91

[56] References Cited

U.S. PATENT DOCUMENTS

| | | | |
|---|---|---|---|
| 4,252,581 | 2/1981 | Anantha et al. | 29/578 |
| 4,252,582 | 2/1981 | Anantha et al. | 148/175 |
| 4,368,573 | 1/1983 | DeBrebisson et al. | 148/187 |
| 4,378,627 | 4/1983 | Jambotkar | 148/187 |
| 4,378,630 | 4/1983 | Horng et al. | 29/578 |
| 4,404,737 | 9/1983 | Kanzaki et al. | 29/578 |
| 4,408,388 | 10/1983 | Kameyama et al. | 29/578 |
| 4,418,468 | 12/1983 | Vora et al. | 29/578 |
| 4,433,470 | 2/1984 | Kameyama et al. | 29/577 C |

OTHER PUBLICATIONS

Jambotkar, C. G., IBM-TDB, 24 (1981) 1305.
Ning et al., IBM-TDB, 22 (1979) 2123.
Chang et al., IBM-TDB, 21 (1978) 578.

*Primary Examiner*—Upendra Roy
*Attorney, Agent, or Firm*—Robert M. Handy

[57] ABSTRACT

A means and method is described for forming closely spaced contacts to adjacent semiconductor regions, such as the base and emitter of a bipolar transistor, so that the lateral voltage drops between the contacts and an intervening junction are minimized. The emitter and base and the contacts thereto are self-aligned. This is accomplished by a structure utilizing two poly-layers separated by one or more intermediate dielectric layers. The upper of the two poly-layers serves as a selective etching mask for defining the contact geometry and separation. The lower of the two poly-layers has one portion which becomes a poly-contact and diffusion source for the base region and a second portion which becomes a poly-contact and diffusion source for the emitter region. A single mask is used in connection with ion bombardment to alter the etch rate of portions of the poly-layers. This mask together with subsequent etch steps, defines the emitter width and location and the base-emitter contact separation. The process is self-aligning.

31 Claims, 23 Drawing Figures

METHOD OF MAKING CLOSELY SPACED CONTACTS TO PN-JUNCTION USING STACKED POLYSILICON LAYERS, DIFFERENTIAL ETCHING AND ION IMPLANTATIONS

FIELD OF THE INVENTION

This invention relates in general to semiconductor devices and, more particularly, to semiconductor integrated circuits employing closely spaced contacts to regions of opposite conductivity type.

BACKGROUND ART

It is commonplace in semiconductor devices to use adjacent regions of opposite conductivity type, as for example the base and emitter of a bipolar transistor or the source and gate of a field effect transistor. Where the semiconductor devices are to operate with high efficiency, at high frequency, and/or with fast switching speeds, it is important to place the contacts to these oppositely doped regions as close as possible to the intervening junction so that lateral voltage drops are minimized. This is particularly true where at least one of the adjacent semiconductor regions has comparatively high resistivity. The emitter-base of a bipolar transistor is an example of such a situation.

One method for providing contacts to adjacent device regions on silicon has been to use an intermediate poly-silicon region or layer between the metallic interconnections and the device regions. For example, with a bipolar transistor a poly-silicon layer is often used as an intermediate contact to the base or emitter region. While poly-silicon contacts have resulted in improved performance, the prior art arrangements and methods have significant drawbacks that limit their usefulness. For example, with the prior art techniques the poly-layer used for a base contact must generally have an initial thickness which is much greater than is otherwise desired. This is because the poly-layer which forms the base contact in the prior art is often exposed to numerous etching and oxidation steps during fabrication. The extra thickness must be provided when the poly-layer is formed to make up for the portions of the poly-layer consumed during processing. This extra thickness is not desirable since it makes fabrication more difficult and degrades performance of the device or circuit. Further, with prior art structures the poly-contacts are often not as close to the junction as is desired and regions of relatively high resistivity material or equivalent can still remain between, for example, the poly-base contact and the base-emitter junction of a bipolar transistor. Thus, a need continues to exist for device contacting structures and device fabrication methods which provide closely spaced contacts to regions of opposite conductivity type, which provide enhanced conductivity regions between the contacts and the junction, and which avoid many drawbacks of the prior art.

Accordingly, it is an object of the present invention to provide an improved structure for making contacts to adjacent semiconductor regions.

It is an additional object of the present invention to provide an improved method for producing contacts to adjacent semiconductor regions.

It is a further object of the present invention to provide the above improved structure and method wherein the contacts are self-aligned.

It is an additional object of the present invention to provide an improved structure and method for fabricating poly-contacts to adjacent semiconductor regions wherein the poly-contacts to one or more of the semiconductor regions are protected from etching and oxidation during device fabrication.

It is a further object of the present invention to provide an improved means and method for semiconductor devices wherein adjacent device regions and/or the contacts to the adjacent regions are self-aligned and their separation precisely controlled.

It is an additional object of the present invention to provide a means and method for including enhanced conductivity regions between the contacts and the junction so as to reduce the series resistance within the device.

As used herein the prefix poly- and the word poly are generally intended to refer to polycrystalline or amorphous materials.

SUMMARY OF THE INVENTION

The attainment of the foregoing and other objects and advantages is achieved wherein there is provided a collector region of a first conductivity type, a base region of a second conductivity type, an emitter region of the first conductivity type, a first poly-region of the first conductivity type in contact with the emitter, a second poly-region of the second conductivity type in contact with the base, a region of enhanced conductivity of the second type in the base region contacting the second poly-region and extending in proximity to the emitter, and a dielectric region separating the first and second poly-regions.

There is further provided a method for fabricating semiconductor devices comprising providing a semiconductor substrate having a first region of a first type overlayed by a second region of a second type, covering the second region with a first poly-layer, covering the first poly-layer with a first dielectric layer, covering the first dielectric layer with a second poly-layer, covering the second poly-layer with a first masking layer which is patterned to form a mask and an open region, doping first portions of the first and second poly-layers via the open region of the masking layer with an etch rate reducing dopant while leaving second portions of the poly-layers under the mask substantially free of this added dopant, removing a peripheral portion of the mask to reduce its lateral extent, removing a first part of the second portion of the second poly-layer leaving a second part beneath the mask, then performing steps (a)–(c) in any order, (a) removing the remaining part of the mask region, (b) removing the second part of the second poly-layer, and (c) removing a first part of the first dielectric layer underlying the first part of the second poly-layer, thereafter performing steps (i)–(iv) in any order, (i) replacing a first part of the second portion of the first poly-layer with a dielectric isolation region leaving a second part of the second portion of the first poly-layer, (ii) removing a second part of the first dielectric layer overlying the second part of the first poly-layer, (iii) doping a first portion of the second region of the substrate underlying the dielectric isolation region, and (iv) doping the second part of the second portion of the first poly-layer.

In a further embodiment, a second dielectric layer is placed between the first dielectric layer and the first poly-layer. This second dielectric layer is locally removed after the first dielectric layer is removed in order to expose the underlying first poly-layer where such exposure is required by the process described above. While additional masking layers beyond that described above may be convenient to accommodate other device fabrication needs they are not necessary for forming the close proximity contacts and enhanced conductivity regions since, beyond the described masking layer, the invented process is self-aligning and self-masking. While the second poly-layer is preferably of polycrystalline semiconductor it can be of any material having an alterable etch rate so as to permit selective etching without masking. Similarly, while the first poly-layer is preferably of polycrystalline semiconductor, it can be of any conductive material having an alterable etch rate to permit selective etching and which can be locally converted to a dielectric. It is preferable to use an etch rate reducing dopant of the second conductivity type since this provides a dopant source for enhancing the conductivity of the second region of the substrate under the first portions of the first poly-layer thereby reducing the resistance of the contact to the second region of the substrate.

The etching of the poly-layers is conveniently carried out using etching procedures which preferentially attack the portions of the poly-layers not doped with the etch rate reducing dopant. The above-described sequence of steps insures that the first region of the first poly-layer which serves as the contact to the second region of the substrate and the second part of the second portion of the first poly-layer which serves as the contact to an oppositely doped region formed in the second region of the substrate, have not been significantly etched or oxidized during fabrication.

It is further convenient to apply heat in order to drive in the dopants provided in steps (iii) and (iv) so that they diffuse laterally as well as vertically into the second region of the substrate so as to be in close proximity, preferably touching. Step (iii) above provides a first region of enhanced conductivity in the second region of the substrate, e.g., a region of enhanced conductivity in the base of a bipolar transistor. Step (iv) above provides a second region of enhanced conductivity in the second region of the substrate usually of opposite conductivity type, so as to form, for example, an emitter in the base of the bipolar transistor. After being heated the enhanced conductivity region from step (iii) extends laterally, on one side, to be in contact with a heavily doped region out-diffusing from the first region of the first poly-layer, e.g., from the base contact, and extends laterally on the other side to be in close proximity to or in contact with the doped region of step (iv), e.g., with the emitter of a bipolar transistor. This minimizes the series resistance in the device. The heating steps can be carried out after each doping step and/or after both doping steps so that the diffusion of the respective impurities can be controlled separately.

DETAILED DESCRIPTION OF THE DRAWINGS

Figure 1:
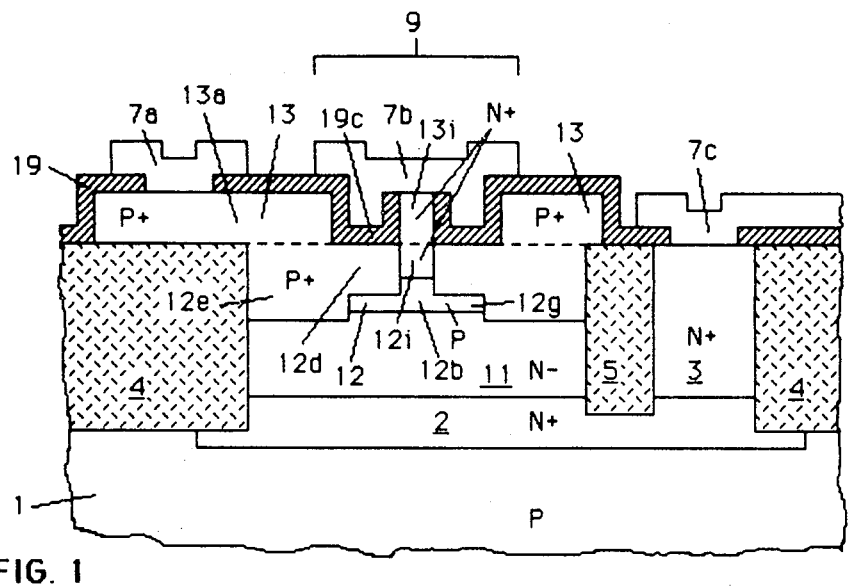
FIG. 1 is a simplified schematic cross-section of a portion of a semiconductor device showing a bipolar transistor fabricated according to the present invention.

FIG. 1 shows a simplified schematic cross-sectional view of a portion of a semiconductor device according to the present invention. For convenience, the structure and method of fabrication are illustrated as for an NPN bipolar transistor. A PNP device is formed by interchanging the various N and P regions. Those skilled in the art will understand that the structures and methods described herein apply to other types of devices as well. Where the terms emitter, base, and collector are used they are intended to include generally any type of device region in any type of device employing adjacent regions of different doping and are not intended to be limited merely to bipolar transistors.

The device of FIG. 1 illustrates a bipolar transistor comprising P substrate 1 on which is placed N+ buried collector 2, N− collector region 11, N+ collector contact region 3, P base region 12, P+ regions 12d-e having their conductivities enhanced compared to P region 12, and emitter region 12i located in base region 12. Dielectric regions 4 isolate the transistor from other devices which may be on the same substrate. Dielectric region 5 separates base region 12 and enhanced conductivity portions 12d-e from collector contact region 3. Poly-layer 13 has P+ region 13a which makes contact to enhanced conductivity portions 12d-e of base region 12. Poly-layer 13 also has N+ region 13i which makes contact with N+ emitter region 12i. Dielectric isolation region 19c separates base contact region 13a and emitter contact region 13i of poly-layer 13. While layer 13 is desirably of poly-silicon and is for convenience referred to herein as being made of a polycrystalline semiconductor material, it can be of any conductive material having an alterable etch rate. The device of FIG. 1 further comprises contact means 7a for contacting portion 13a of poly-layer 13 which functions as a base contact via regions 12d-e of base region 12, contact means 7b for contacting part 13i of poly-layer 13 which contacts emitter 12i, and contact means 7c for contacting collector contact region 3.

A feature of the device of FIG. 1 is that enhanced conductivity portions 12d-e connect to poly-contact 13a on one end and at the other end are in close proximity to or touching emitter region 12i. This reduces the series resistance in this region of the device and thereby improves performance. Further, enhanced conductivity portion 12d is made deeper than emitter 12i to further reduce the series resistance while leaving portion 12b of base 12 underneath emitter 12i at the comparatively higher resistivity of undisturbed base region 12 so that the efficiency of emitter 12i is not degraded. Dielectric isolation region 19c separates base contact 13a from emitter contact 13i and prevents emitter contact means 7b from shorting to base 12 or base contact 13a. The device of FIG. 1 is fabricated according to the procedures described in connection with FIGS. 2A-K and 3A-K.

FIGS. 2A-K show in simplified schematic form a series of cross-sections of central portion 9 of the device of FIG. 1, somewhat enlarged, during different stages of fabrication. Semiconductor substrate 1 (see FIG. 1) is provided having first region 11 and second region 12. For the example of an NPN bipolar transistor, first region 11 is N− and functions as the collector and second region 12 is P and functions as the base. The described procedures are applicable to any device containing a PN junction. For simplicity, substrate 1 and buried collector 2 are not shown in FIGS. 2A–K and 3A–K.

Figure 2A:
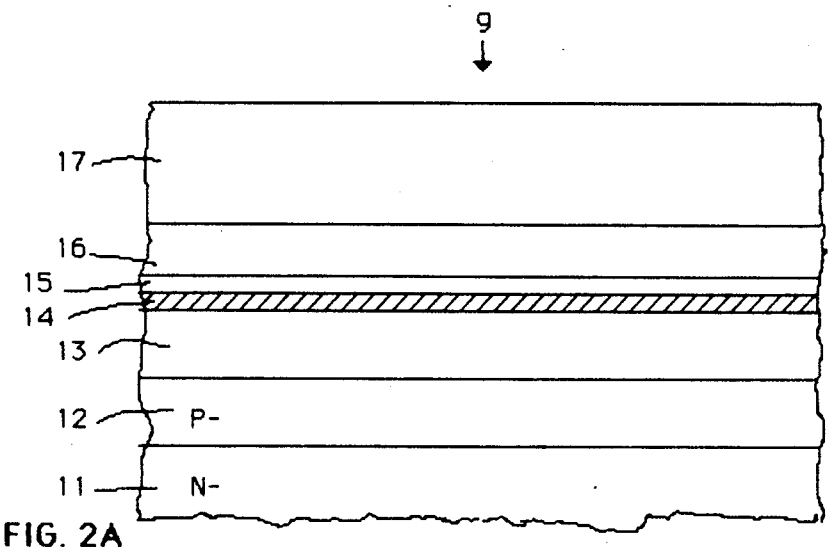
FIGS. 2A-K show in simplified schematic form a series of cross-sections of the central region of the device of FIG. 1 at various stages of fabrication and according to a preferred embodiment of the present invention.
Figure 2B:
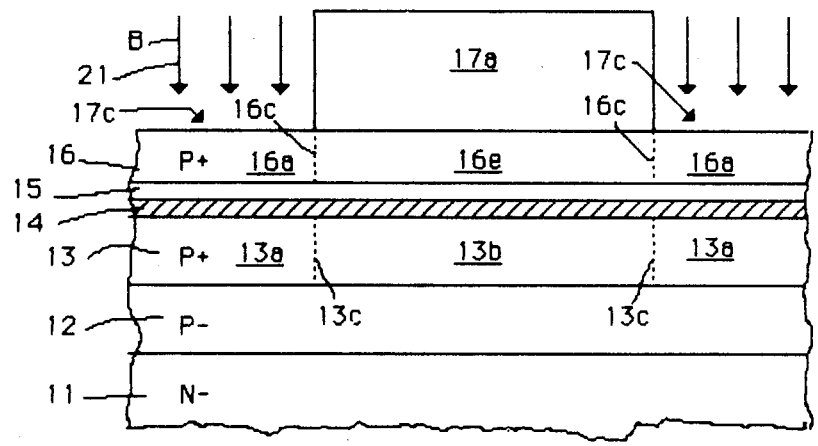

As shown in FIG. 2A, region 12 is covered by first poly-layer 13. With silicon devices, poly-layer 13 is desirably undoped polysilicon. First poly-layer 13 has a thickness usefully in the range 0.05 to 0.30 microns with 0.1 to 0.25 preferred. While layer 13 can be made thicker than about 0.30 microns, this increases the difficulty in producing device regions of fine dimensions and is not desirable. While layer 13 can be made thinner than about 0.05 microns, this increases the series resistance of the layer and is not desirable. Other materials can be used for first poly-layer 13 so long as they have or can be doped to have a conductance greater than the conductance of base region 12, and also so long as they have an alterable etch rate to permit selective etching of different portions of the layer. It is intended to include all such materials when referring to the first poly-layer or to poly-layer 13.

Poly-layer 13 is covered with first dielectric layer 14. First dielectric layer 14 is conveniently of silicon oxide with a thickness in the range 0.05 to 0.15 microns with 0.08 to 0.12 microns preferred. First dielectric layer 14 is desirable but not essential (FIGS. 3A–K illustrate the fabrication sequence when layer 14 is omitted). First dielectric layer 14 is covered with second dielectric layer 15. Second dielectric layer 15 should be of a material which resists etching by reagents, chemical species, or other means which etch layer 13. It is convenient if layer 15 is also differentially etchable with respect to layers 14 and/or 16, although this is not essential. Layer 15 is conveniently of silicon nitride with a thickness in the range 0.05 to 0.15 microns, preferably 0.08 to 0.12 microns.

Second dielectric layer 15 is covered with second poly-layer 16. Second poly-layer 16 is conveniently of undoped poly-silicon although other materials which have an alterable etch rate to permit selective etching of different portions of the layer can also be used. When referring to the second poly-layer or poly-layer 16 it is intended to include such other materials. Poly-layer 16 is conveniently 0.10 to 0.30 microns thick with 0.10 to 0.20 microns being preferred. Second poly-layer 16 is covered by masking layer 17. Masking layer 17 is conveniently of a refractory material such as silicon oxide with a thickness in the range 0.05 to 1.5 microns, preferably 0.5 to 0.75 microns. However, other materials resistant to the etchants used to remove portions of layer 16 can also be used.

Masking layer 17 is patterned by any convenient method (FIG. 2B) to produce mask 17a and open regions 17c. Portions 16a of layer 16 and 13a of layer 13 are doped with an etch rate altering dopant so that the etch rate of regions 13a and 16a are reduced as compared to the etch rates of regions 13b and 16b. This is conveniently accomplished by ion implanting portions 13a and 16a in open regions 17c as indicated by arrows 21. Boron is a convenient material known to reduce the etch rate of poly-silicon in alkali etchants such as KOH, as compared to undoped polysilicon. Other etchants are known to etch doped and un-doped poly-silicon at different rates and can also be used. A dose of about $1 \times 10^{16}$ boron ions per cm$^2$ will alter the etch rate of un-doped poly-silicon by a sufficient amount to permit differential etching, although higher or lower doses can also be used. Generally, the higher the dose the greater the differential etch rate between the doped and undoped portions of the layer.

The implantation energy must be such as to provide sufficient penetration to reach portion 13a as well as portion 16a. Two implants at different energies are conveniently used, a high energy implant to reach portion 13a and a lower energy implant to reach portion 16a. Means for implanting dopants at different depths are well-known in the art. Mask 17a protects portions 13b and 16b of layers 13 and 16 during implant so that portions 13b and 16b remain substantially free of etch rate altering dopant 21. Dotted lines 13c and 16c indicate the boundaries within layers 13 and 16 separating the altered etch rate portions from the unaltered etch rate portions of the layers. Other means of altering the etch rate may also be used and when referring to the step of doping layers 13 and 16 with an etch rate reducing dopant it is intended to include such other methods.

Figure 2C:
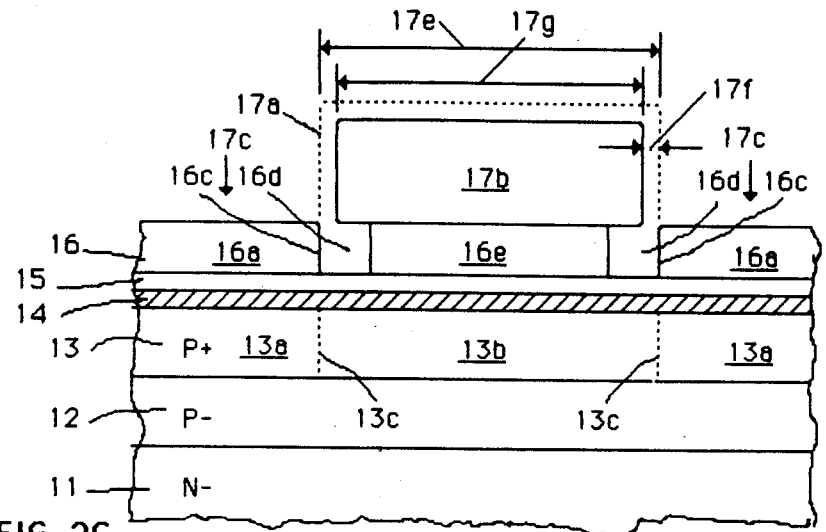

As indicated in FIG. 2C, width 17e of mask 17a is reduced by predetermined amount 17f to give slightly smaller mask 17b of width 17g. The combination of initial width 17e, reduction amount 17f, and the subsequent etching times for layers 13–16 determine the width of emitter 12i (see FIGS. 1 and 2K) and the separation between the emitter contact 13i (or emitter 12i) and base contact 13a (or enhanced conductivity regions 12d–e). A particular feature of the present invention is that reduction amount 17f is not dependent on a further masking and/or mask alignment step. Portion 17f of mask 17b is conveniently removed by maskless etching.

Following the formation of reduced size mask 17b, parts 16d (FIG. 2C) of portion 16b of layer 16 are removed leaving behind part 16e of portion 16b of layer 16. Parts 16d are preferably removed by differential etching using a reactant which attacks portion 16b of layer 16 more rapidly than portions 16a of layer 16. When boron has been implanted into portions 16a, as shown by arrows 21 in FIG. 2B, KOH is a suitable etchant for portions 16d. Other etchants exhibiting differential etching as a function of doping level can also be used. At a dose of about $1 \times 10^{16}$ boron ions/cm$^2$, a KOH etch of about 23% concentration by weight in water gives a differential etch rate of about 20 to 1 for undoped poly as compared to poly which has been boron doped as described above. Mask size reduction amount 17f need not be large but must be sufficient to allow the etching species to reach undoped portion 16b of layer 16 so that differential etching can occur. Reduction amount 17f is conveniently in the range 0.05 to 0.15 microns with 0.09 to 0.11 microns preferred. Amount 17f can be larger if larger openings 16d are desired, but this reduces the width of resulting emitter region 12i and emitter contact 13i. It is not desirable to make amount 17f smaller than about 0.05 microns since this increases the time required to etch away portion 16d and leads to variations in the width of portion 16d across the substrate.

Following the removal of portions 16d of layer 16, mask 17b is removed by any convenient method. Where mask 17b is of silicon oxide this is easily accomplished by wet or dry etching using means well-known in the art. A feature of the present invention is that mask 17b may be readily removed by etchants which act differentially, that is, etching mask 17b (e.g. of oxide) preferentially to the exposed portions of layer 16 (e.g. of polysilicon) and layer 15 (e.g. of nitride). Such differential etchants are well-known in the art. Thus, mask 17b may be removed without a further masking step.

Figure 2D:
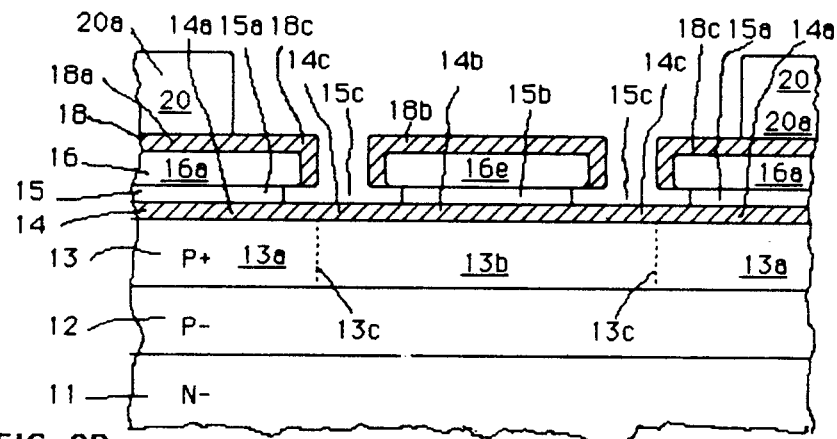

FIG. 2D illustrates the next stage of the process wherein first portions 15c of dielectric layer 15 are removed, exposing first portions 14c of dielectric layer 14. This may be accomplished by means well-known in the art. It is not necessary to apply an additional masking layer during this operation since portion 15c can be etched differentially with respect to layers 14, 16, and/or 18.

Also illustrated in FIG. 2D is the optional step of oxidizing layer 16 to produce surface oxide layer 18 on layer 16. This oxidation step is sometimes desirable to facilitate fabrication of other components in an integrated circuit, such as covering diffused or poly-silicon resistors remote from the device region illustrated in FIGS. 2A-K. Formation of layer 18 is not essential to the present invention, but is permitted by the invented process. Layer 18 can be formed before or after removal of portions 15c of layer 15, but is preferably formed prior to removal of portion 15c.

A further optional step illustrated in FIG. 2D is the formation of second masking layer 20 having mask portions 20a protecting portions 18a of layer 18 leaving portions 18b-c of layer 18 and portions 15c of layer 15 and 14c of layer 14 exposed. Mask 20a may be of any convenient material which resists reactants suitable for etching the material of layers 14 or 18. Photoresist is suitable. While mask 20a is convenient for protecting other portions of the device or circuit remote from the device regions described in connections with FIGS. 2A-K, it is not essential to the present process. When mask 20a is used, it need not be precisely aligned with regions 15c or 16a-b, since the invented process is self-masking and self-aligning with respect to the junction which will be formed between the adjacent semiconductor regions and the closely spaced contacts thereto.

Figure 2E:
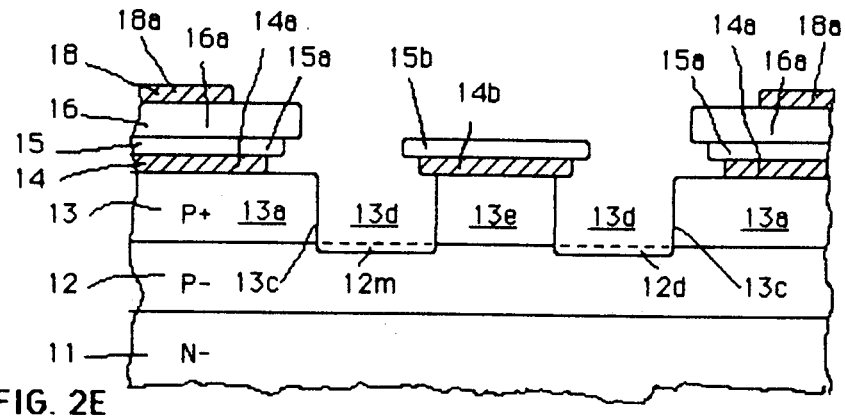

Portions 18b-c are removed to expose the portions of layer 16 not under mask 20a (FIG. 2E). Following removal of portion 15c of dielectric layer 15 (FIG. 2D), portion 14c of layer 14 is also removed to expose the underlying portions of layer 13 (FIG. 2E). It is convenient to remove portions 14c and 18b-c simultaneously, but this is not essential. Portions 18b-c may be removed before or after removal of portions 15c. Once portion 15c of layer 15 has been removed, then part 16e of portion 16b of layer 16 is no longer needed and is removed by any convenient method. It is preferable to remove part 16e by differential etching with the same KOH etching technique used to remove part 16d of portion 16b of layer 16. No additional masking operation is needed since part 16e of layer 16 etches much more rapidly than etch rate altered portions 16a of layer 16. Hence, part 16e of portion 16b can be removed without significant etching of portion 16a. Part 16e is conveniently removed at the same time as parts 13d. Removal of part 16e exposes portion 15b of layer 15 which overlies portion 14b of layer 14 and part 13e of layer 13. When mask 20a has been used, portion 18a of layer 18 also remains, as is illustrated in FIG. 2E. Portion 16a of layer 16 also remains since it is not significantly etched by the differential etchant used to remove part 16e (see FIG. 2E). After its function is complete optional mask 20a is removed by means well-known in the art.

After portions 15c and 14c have been removed exposing the underlying regions of layer 13, parts 13d of portion 13b of layer 13 are removed by any convenient method. Portions 13d are preferentially removed by differential etching as was used to remove parts 16d and 16e of layer 16. It is important that portion 13a of layer 13 remain substantially unetched during this step. This feature is provided by the differential etching process described earlier wherein the KOH etch attacks boron doped poly-silicon much more slowly than undoped poly-silicon. Other etch rate alterable materials and/or selective etchants can also be used for parts 13d of layer 13. It is desirable (FIG. 2E) to continue etching parts 13d until the surface of layer 12 is reached and preferable to slightly over-etch to remove surface region 12m of layer 12. However, this is not essential. Part 13e of portion 13b of layer 13 is protected by layers 15b and 14b and remains after removal of parts 13d. A feature of the present invention is that parts 13d are removed and part 13e left in place without need for any further masking or alignment steps.

Figure 2F:
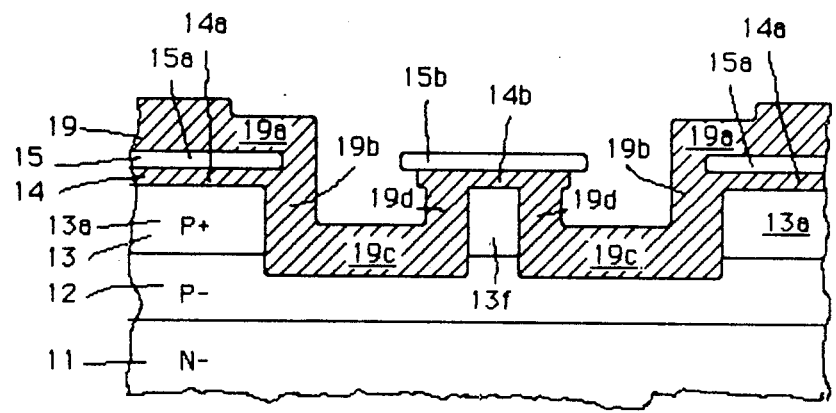
Figure 2G:
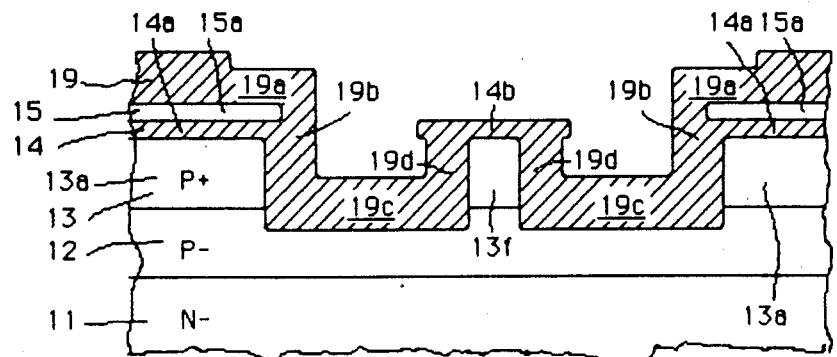
Figure 2H:
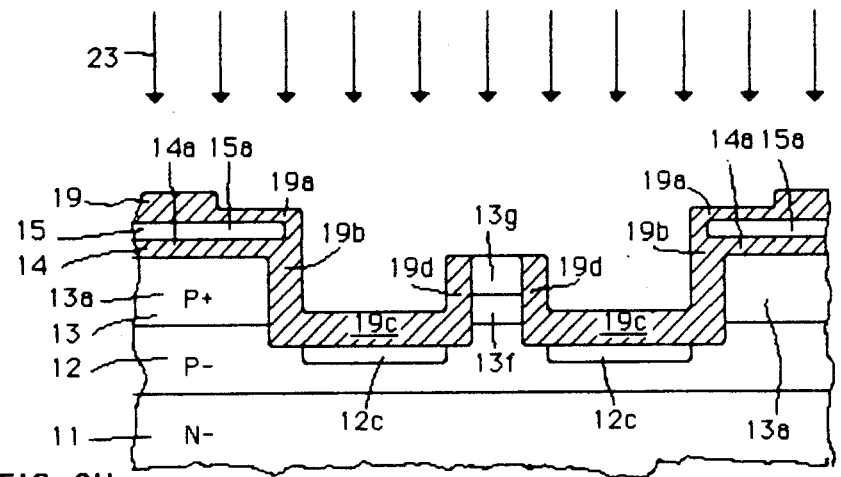

In FIG. 2F dielectric layer 19 is formed by any convenient method, preferably by oxidation of the exposed portions of region 12 and layers 13 and 16. Means for oxidation of semiconductor regions and layers to form dielectric layers, as for example, silicon oxide are well known in the art. Other means can also be used. When isotropic oxidation is used the exposed vertical sidewalls of portions 13a and part 13e of layer 13 are partly converted to dielectric by growth of oxide regions 19b and 19d on the sidewalls. However, this is not essential. Part 13f of portion 13b of layer 13 remains undisturbed beneath dielectric layer regions 15b and 14b. Portion 19c of dielectric layer 19 acts as a dielectric isolation region to separate portions 13a of layer 13 from part 13f of layer 13. Portion 15b of layer 15 is then desirably removed (FIG. 2G). This is conveniently accomplished by a dip etch. No further masking or alignment step is required. An additional mask-less etching step is used to remove portion 14b above part 13f of portion 13b of layer 13, thereby exposing part 13f (FIG. 2H).

Ions 23 are implanted in part 12c of region 12 underneath dielectric isolation portion 19c. This is conveniently accomplished without a further masking operation. As far as the device of FIG. 1 is concerned it does no harm to have ions 23 implanted everywhere. Part 12c can be implanted before or after removal of portions 15b and 14b, so long as the result of the implant is to enhance the conductivity of part 12c of region 12. If part 12c of region 12 is implanted without masking part 13f of portion 13b of layer 13, then ions 23 will also be implanted in part 13f forming doped region 13g in part 13f at the same time as part 12c of region 12.

It is desirable that dopant ions 23 be of the second conductivity type so that part 12c is doped to a higher concentration of the same conductivity type as present in region 12. In this way, part 12c provides a region of enhanced conductivity in region 12. When dopant ions 23 are of the same type as used for doping portions 13a of layer 13, it is immaterial if any of ions 23 penetrate through layer portions 19a, 15a, and 14a into region 13a of layer 13. At most this further reduces the resistance of region 13a, which is desirable.

Figure 2I:
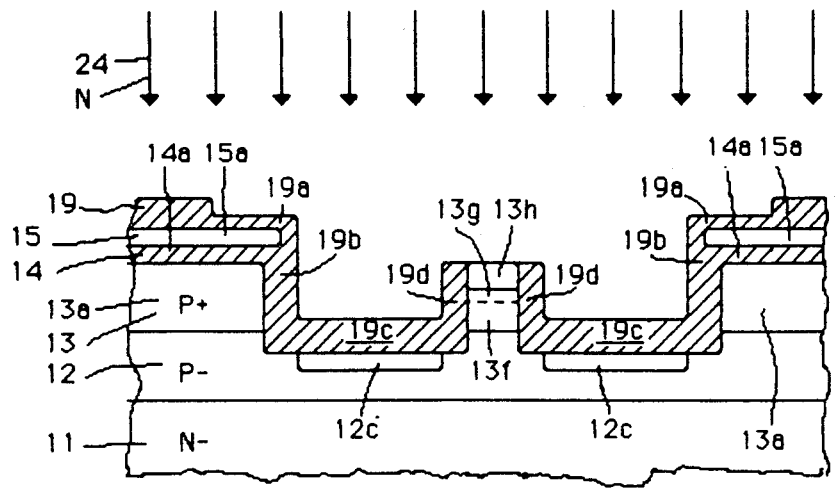

Ions 24 are implanted in region 13h of part 13f of layer 13 FIG. 2I. It is desirable that ions 24 be of opposite conductivity type to ions 23 and be implanted at a lower energy than ions 23 and to a higher dose. Using a lower implant energy permits ions 24 to be implanted into region 13h without penetrating layer 19 and being implanted into region 13a or region 12. Thus region 13h of part 13f can be doped selectively with ions 24 without need for any additional masking or alignment step, although other parts of the circuit may be masked if so desired. The dose of ions 24 must be high enough relative to the dose of ions 23 so that the doping type of ions 24 predominates in region 13h and other regions which have received both implants.

Figure 2J:
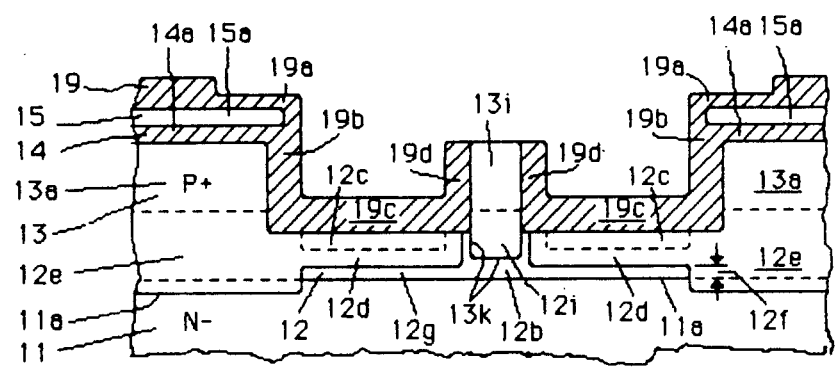

The substrate and various layers are heated to remove the implant damage if any associated with implantation of ions 23 and 24, to activate the implanted ions, and to drive these impurities further into the structure, as indicated in FIG. 2j. Heating may be carried out during or after each ion implantation or after both implantations, and in one or more stages, or any combination thereof. Multiple heating steps are useful for separating adjusting the depths of the various doped regions.

It has been found that when ions 23 are P type and ions 24 are N type, that the N type impurity ions diffuse into part 13f of layer 13 more rapidly than the P type impurity so that substantially all of part 13f becomes converted to N type region 13i. The presence of the N type dopant in region 13h appears to inhibit the diffusion of the P type dopant from region 13g. Thus, even though both types of impurities are present in part 13f, the N type impurity dominates and part 13f of layer 13 converts to N type region 13i. Region 13i acts as an N type diffusion source for doping underlying portion 12i of region 12 strongly N type when the substrate is heated after the implantations (see FIG. 2J).

Heating drives the P type impurities present in region 13a into the underlying portions of region 12 to form expanded enhanced conductivity regions 12e. Heating also drives the P type impurities present in region 12c into the underlying portions of region 12 to form expanded enhanced conductivity regions 12d. If the concentration in region 13a is higher than in region 12c, region 12e will be deeper than region 12d. While these impurities are diffusing vertically into layer 12 they also spread laterally under portions 19b and 19d of dielectric layer 19 so that continuous regions 12d-e of enhanced conductivity are formed beneath dielectric isolation regions 19b-d. Enhanced conductivity regions 12d-e connect to doped poly-layer region 13a and extend to be in close proximity to or touching junction 13k between P region 12 and N region 12i. This significantly reduces the lateral series resistance which would otherwise be present in region 12 between contact 7a (see FIG. 1) and junction 13k.

A further advantage of this invention is that distance 12f between enhanced conductivity region 12d and junction 11a can be made very small or zero while still leaving a greater thickness of lightly doped material of region 12 in portion 12b beneath oppositely doped region 13i. This is of substantial aid in reducing the series resistance in region 12 while still maintaining an adequate vertical separation across region 12b between junction 11a and the parallel portion of junction 13k. In a bipolar transistor for example, a minimum base width must be maintained in order to have satisfactory device performance. Thus, active base region 12b cannot be made too thin. Gap 12f below enhanced conductivity region 12d is not so constrained and it is desirable to make it as small as possible. Gap 12f can be made smaller than the thickness of region 12b by heating the substrate after implanting ions 23 but before implanting ions 24. This drives the P type impurities of region 12d deeper into region 12 before the N type impurities are implanted into part 13f. Thus, a feature of the present invention is that gap 12f and the width of region 12b can be adjusted separately. This is illustrated further in connection with the discussion of FIGS. 3A-K. Region 12d can be driven through region 12 to directly contact region 11 so that gap 12f is zero.

Figure 2K:
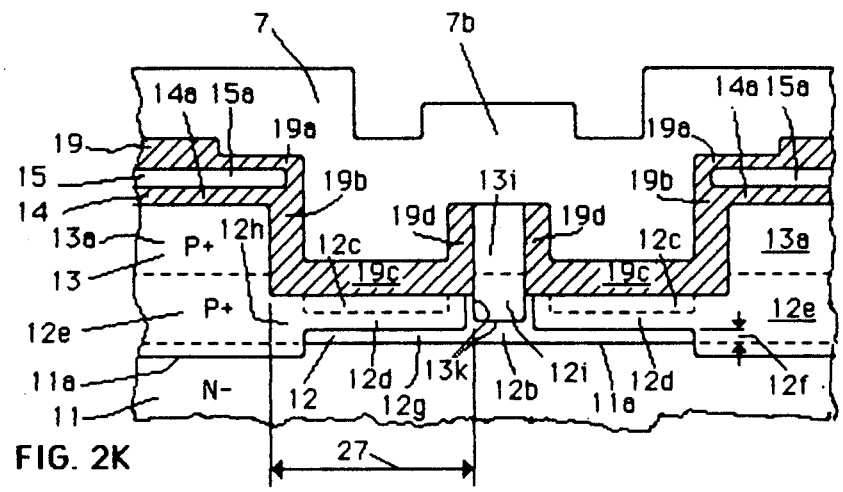

After the ion implantation steps described above, layer 7 of FIG. 2K is applied to provide electrical connection to poly-layer 13. Part 13i, doped for example N type, acts as a low resistance contact between N type doped region 12i and layer 7. Portion 13a, doped for example P type, acts as a low resistance contact between P type region 12 and layer 7. Layer 7 of FIG. 2K is patterned using a single mask by means well-known in the art to provide separate contact means 7a-c, as shown in FIG. 1. There is no need for a precision alignment since contact means 7b to part 13i can extend above enhanced conductivity regions 12d and poly contact region 12e without short circuit, being separated therefrom by dielectric layer 19. This is a substantial aid in increasing manufacturing yield.

FIGS. 3A-K show in simplified form a series of cross-sections of central portion 9 of the device of FIG. 1, somewhat enlarged, during various stages of fabrication and according to further embodiments of the present invention. FIGS. 3A-K and the associated process steps are similar to FIGS. 2A-K and associated process steps. The same identifying numbers are used to identify analagous layers, regions, portions, and parts in FIGS. 2A-K and 3A-K. Because of the similarity of the general process as between the methods illustrated by FIGS. 2A-K and FIGS. 3A-K, the process description accompanying FIGS. 2A-K is incorporated herein by reference and the discussion which follows focusses only on the differences between the methods illustrated by FIGS. 2A-K and FIGS. 3A-K.

In the process flow illustrated by FIGS. 3A-K, layer 14 and all steps associated with layer 14 are omitted and layer 16 is thinner than with the method of FIGS. 2A-K. This is desirable since, higher resolution can generally be obtained when thinner layers are used. Further, process time is shortened.

Figure 3K:
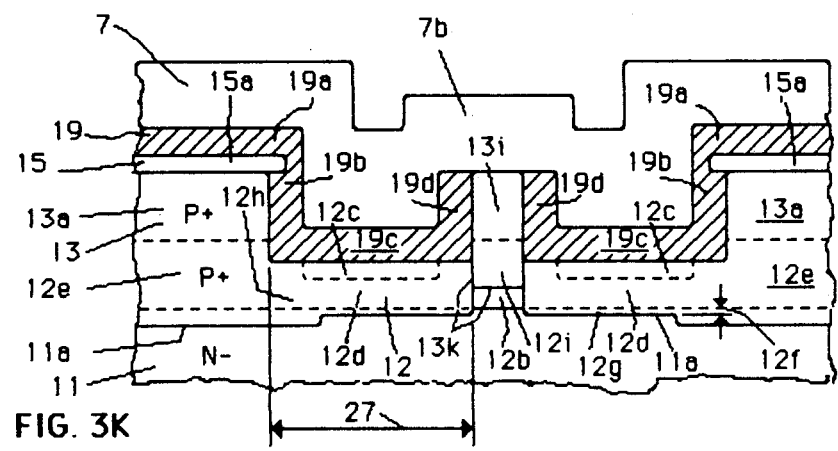
FIGS. 3A-K show in simplified schematic form a series of cross-sections of the central region of the device of FIG. 1 at various stages of fabrication, similar to FIGS. 2A-K, but according to further embodiments of the present invention.
Figure 3A:
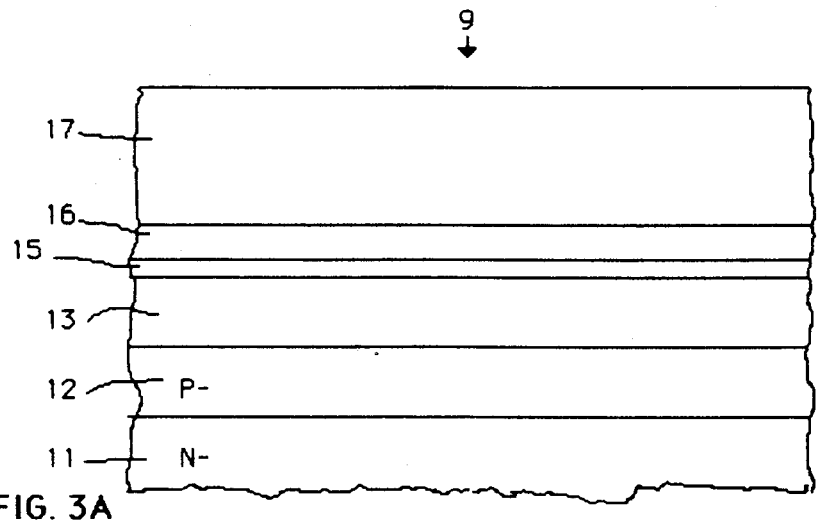
Figure 3B:
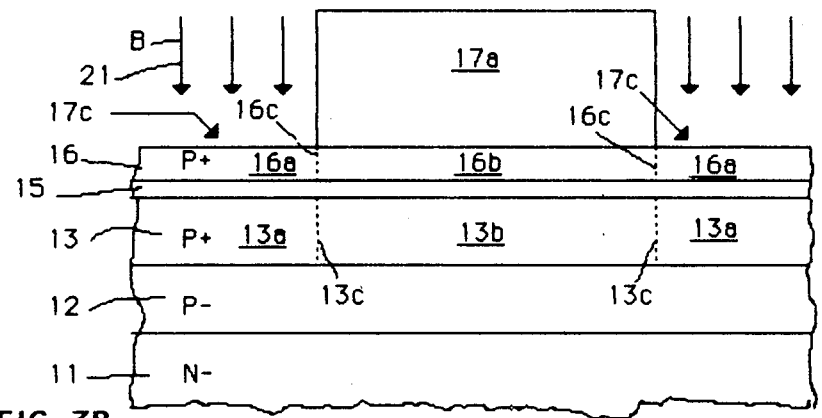
Figure 3C:
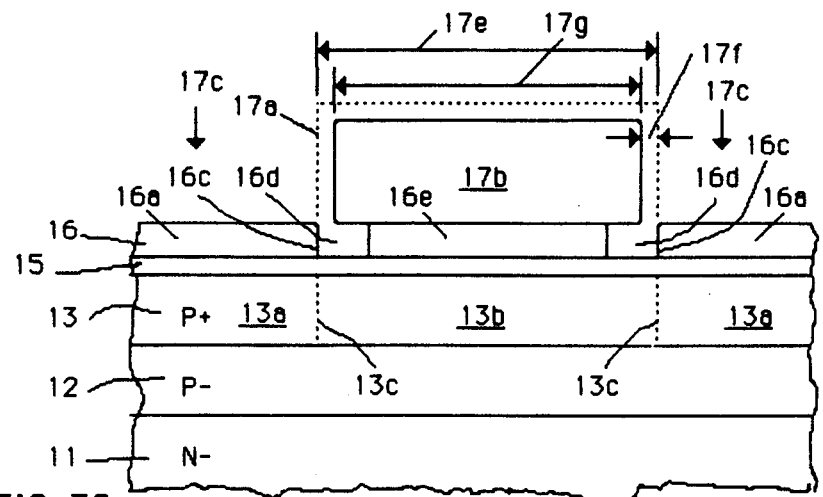
Figure 3D:
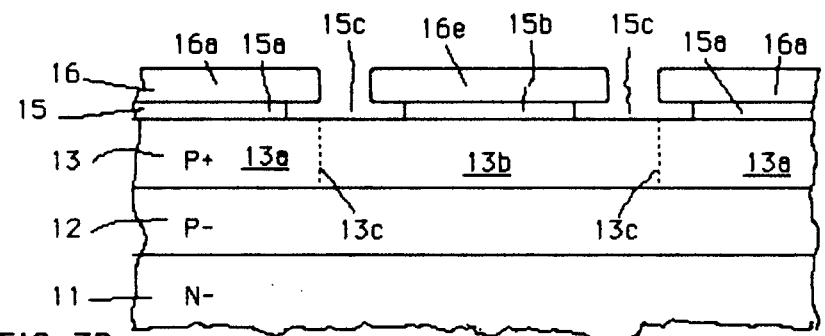
Figure 3E:
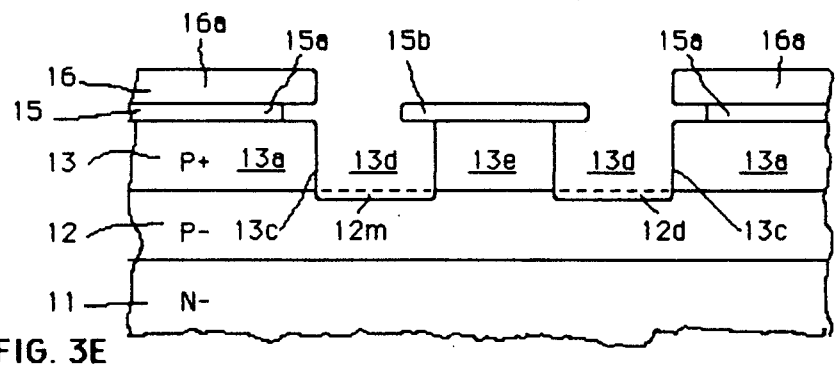
Figure 3F:
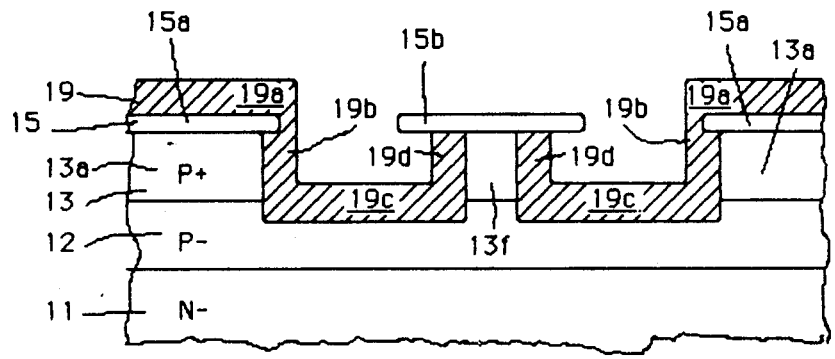
Figure 3G:
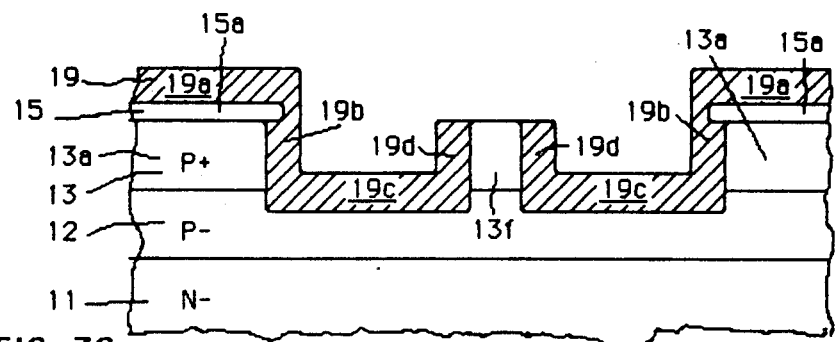
Figure 3H:
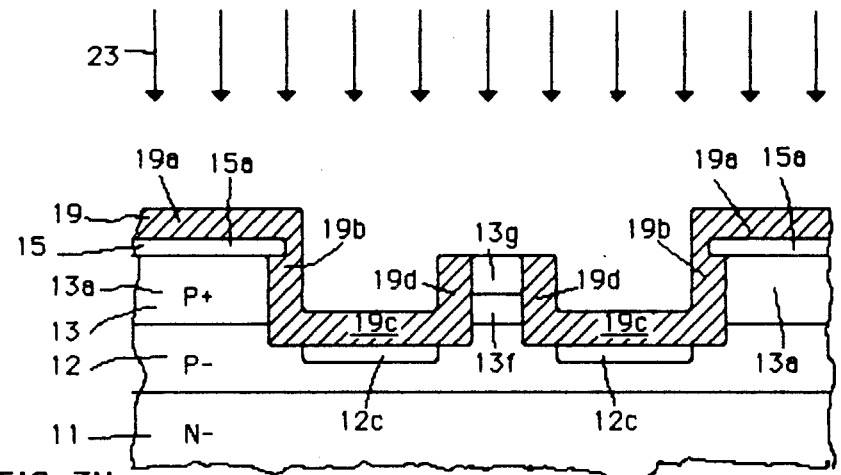

Summarizing briefly, in FIG. 3A regions or layers 11, 12, 13, 15, 16, and 17 are provided in the same way as discussed as in connection with FIG. 2A. In FIG. 3B, mask 17a is formed and ions 21 implanted in portions 13a and 16a through open regions 17c, in the same manner as has been described previously in connection with FIG. 2B. In FIG. 3C, portion 17f of mask 17a is removed to give mask 17b, and part 16d of portion 16b of layer 16 is removed in the same manner as in FIG. 2C, leaving behind part 16e. Portion 15c of layer 15 is removed (FIG. 3D) exposing the underlying portions of layer 13, as in FIG. 2D but without layer 14. FIG. 3D also illustrates the situation when layer 18 and the process steps associated therewith described in connection with FIG. 2D are omitted. FIG. 3D also illustrates the omission of mask layer 20 and mask 20a. As previously noted in connection with FIG. 2D, mask layer 20 and mask 20a are optional. In FIG. 3E, part 16e of layer 16 and parts 13d of portion 13d of layer 13 are removed using differential etching in the same manner in which parts 16e and 13d were removed in connection with FIG. 2E. In FIG. 3F, dielectric layer 19 is formed in a manner analagous to the formation of layer 19 in FIG. 2F. FIG. 3F illustrates further the situation when dielectric layer 19 is formed by oxidation of portion 16a of poly-layer 16 and the exposed surface portions of layer 13 and region 12. Layer 19 in FIG. 3F has the same function as layer 19 in FIG. 2F. Portion 15b of layer 15 is removed (FIG. 3G) and portions 12c and 13g implanted with ions 23, as described in connection with FIGS. 2G–H. Implantation of ions 23 can be performed before or after removal of portion 15b, preferably before.

Figure 3I:
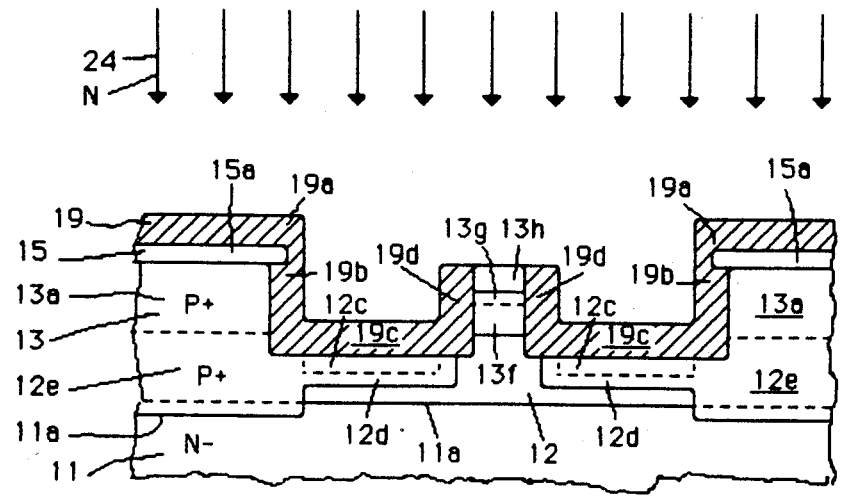
Figure 3J:
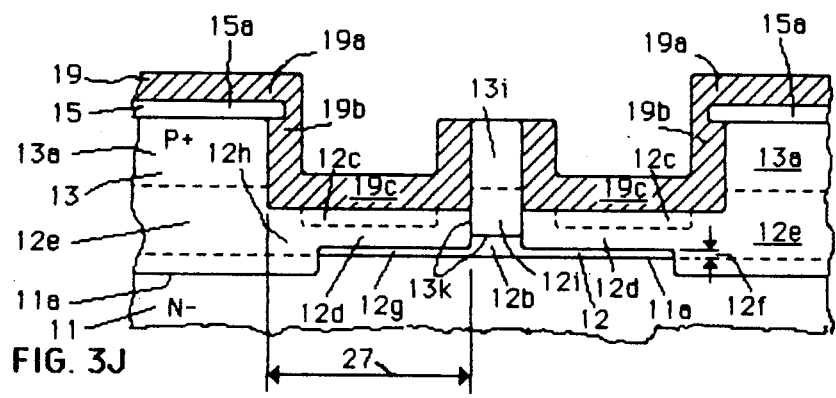

FIGS. 3I–J illustrate the effect of heating the substrate to drive in impurity ions 23 implanted in region 12c prior to implantation of ions 24. In FIG. 3I, doped regions 12c and 13a have expanded vertically and horizontally due to the heating, forming enlarged enhanced conductivity regions 12d and 12e. Region 12e is doped by impurities coming from region 13a and region 12d is doped by impurities coming from region 12c. It is desirable that region 13a be more heavily doped than region 12c so that region 12e will expand more rapidly than region 12d.

Impurity ions 24 are implanted to form doped region 13h. Additional heating after implant of ions 24 has the effect illustrated in FIG. 3J of further deepening and broadening regions 12d–e while region 12i is formed by the diffusion of dopant ions 24 from region 13h. By varying the implant and drive-in heating cycles, width 12f of region 12g between region 12d and junction 11a can be adjusted as in FIG. 2K or 3K and can be made small or zero. It may penetrate beyond the original location of junction 11a without harm, as shown in FIG. 3K. The additional heating increases the lateral spreading of region 12d so that it abuts junction 13k. This increased lateral spreading also enlarges regions 12d–e near corner 12h where enhanced conductivity regions 12d–e join. This further reduces the series resistance across gap 27 between poly-contact portion 13a and junction 13k. This is advantageous. FIG. 3K also illustrates the application of contact means 7b, as discussed in connection with FIG. 2K.

A feature of the present invention is that the separation 27 between poly-contact portion 13a and junction 13k of emitter 12i is determined, (less any lateral spreading of the emitter) by the amount of lateral reduction made in mask 17a and the duration of the subsequent etching steps. This allows separation 27 to be maintained at a very small value and carefully controlled.

Having described the invention, it is apparent that the present invention provides an improved means and method for forming adjacent semiconductor regions having closely spaced and low resistance contacts. Further, it is apparent that the means and method provides a contacting arrangement which is self-aligned and self-masking and which is very convenient for producing self-aligned device regions with closely spaced contacts as are often required, for example, in high performance high density integrated circuits. The structure and method apply to any adjacent semiconductor regions separated by a junction and are not limited merely to forming emitter and base regions of bipolar transistors. Additionally, the poly-regions forming the actual contacts to the active semiconductor regions are protected from etching and oxidation during manufacture and do not have their thickness reduced as a result of the process. Accordingly, thinner layers can be used to start with. This is advantageous.

It will be apparent as illustrated in FIG. 1, that the steps of FIGS. 2A–K or 3A–K can be applied to form an N+ poly-region in contact with collector contact region 3 by creating above region 3 an N+ poly-region analagous to emitter contact region 13i. The portion of the poly-layer analagous to regions 13a and 13d would be located over oxide regions 4 and 5. This gives the additional advantage of providing self-aligned poly-contacts to emitter, base, and collector of the device.

While the invention has been illustrated in terms of particular semiconductor device structures those of skill in the art will appreciate that the principles taught herein apply to other device structures as well. Further, the structures are illustrated as being symmetrical, that is, the portions to the left and right of the center of the figures are substantially the same. This is usually the case where devices having very small area emitters are desired. The use of mask 17a of predetermined width, as shown, produces an emitter 12i of predetermined width. Those of skill in the art will understand that mask 17a may be much wider, as would be obtained, for example, if the illustrated figures were cut in half by a vertical line at their midpoint and pulled apart horizontally from the cutline, with the layers intersecting the cutline being extended between the two halves. Such a structure would be used, for example, in connection with a device having a comparatively large emitter area, but still requiring a base contact spaced very close to the emitter-base junction and having a low resistance path therebetween. Further, while the means and method of the present invention have been illustrated for an NPN device, those of skill in the art will understand that by interchanging the dopants, substantially the same process is used to produce a PNP device. Accordingly, it is intended to include all such variations in the claims which follow.

We claim:

1. A method for fabricating closely spaced contacts to a PN junction comprising:

providing a semiconductor substrate having therein a first region of a first conductivity type and a second region of a second conductivity type overlying said first region;

covering said second region with a first polycrystalline semiconductor layer;

covering said first polycrystalline layer with a first dielectric layer;

covering said first dielectric layer with a second dielectric layer;

covering said second dielectric layer with a second polycrystalline layer;

covering said second polycrystalline layer with a first masking layer;

patterning said first masking layer to form an open region above a first portion of said second polycrystalline layer and a mask region above a second portion of said second polycrystalline layer;

doping first portions of said first and second polycrystalline layers with an etch rate reducing dopant through said open region of said masking layer leaving second portions of said first and second polycrystalline layers under said mask region substantially free of said etch rate reducing dopant;

removing a peripheral portion of said mask region to reduce its lateral extent by a predetermined amount;

removing a first part of said second portion of said second polycrystalline layer leaving a second part underneath said mask region;

then performing steps (a)–(d) in any order:

(a) removing the remaining part of said mask region;

(b) removing a first part of said second dielectric layer underlying said first part of said second portion of said second polycrystalline layer;

(c) removing said second part of said second polycrystalline layer; and (d) after said first part of said second dielectric layer has been removed, removing a first part of said first dielectric layer underlying said first part of said second dielectric layer;

thereafter performing the steps (i)–(v) in any order:

(i) replacing a first part of said second portion of said first polycrystalline layer with a dielectric isolation region, leaving a second part of said second portion of said polycrystalline layer;

(ii) removing a second part of said second dielectric layer overlying said second part of said second portion of said first polycrystalline layer;

(iii) removing a second part of said first dielectric layer overlying said second part of said second portion of said first polycrystalline layer;

(iv) doping a first portion of said second region of said substrate underlying said dielectric isolation region; and (v) doping said second part of said second portion of said first polycrystalline layer;

thereafter heating said substrate to drive the dopant provided in step (v) above into a second portion of said second region of said substrate proximate to said first portion of said second region of said substrate; and providing contact means for contacting said second part of said second portion of said first polycrystalline layer.

2. The method of claim 1 wherein the step of doping with said etch rate reducing dopant comprises doping with a dopant of said second conductivity type.

3. The method of claim 1 wherein said step of removing a peripheral portion of said mask region comprises removing said peripheral portion without a further masking operation.

4. The method of claim 1 wherein said step of removing a first part of said second portion of said second polycrystalline layer comprises removing said first part without a further masking operation.

5. The method of claim 1 wherein said step of removing a first part of said second portion of said second polycrystalline layer comprises removing said first part by means of differential etching with an etchant that attacks said first portion of said second polycrystalline layer less rapidly than said second portion of said second polycrystalline layer.

6. The method of claim 1 wherein said step of replacing a first part of said second portion of said first polycrystalline layer with a dielectric isolation region comprises removing a first part of said second portion of said first polycrystalline layer by means of differential etching with an etchant that attacks said first portion of said first polycrystalline layer less rapidly than said second portion of said first polycrystalline layer, leaving a second part of said second portion of said first polycrystalline layer, and then forming a dielectric isolation region between said first portion of said polycrystalline layer and said second part of said second portion of said first polycrystalline layer.

7. The method of claim 1 wherein said step of removing a second part of said first dielectric layer overlying said second part of said second portion of said first polycrystalline layer comprises removing said second part without a further masking operation.

8. The method of claim 1 wherein said step of doping a first portion of said second region of said substrate underlying said dielectric isolation region comprises doping said first portion without a further masking operation.

9. The method of claim 1 wherein said step of doping a first portion of said second region of said substrate underlying said dielectric isolation region comprises doping said first portion to a higher level of said second conductivity type.

10. The method of claim 1 wherein said step of doping said second part of said second portion of said first polycrystalline layer comprises doping said second part with an impurity of said first conductivity type.

11. The method of claim 1 wherein said step of doping said second part of said second portion of said polycrystalline layer comprises doping said second part without a further masking operation.

12. The method of claim 1 wherein said first covering step comprises covering said second region with a substantially undoped first polycrystalline semiconductor layer.

13. The method of claim 1 wherein said fourth covering step comprises covering said second dielectric layer with a substantially undoped second polycrystalline semiconductor layer.

14. The method of claim 6 wherein said step of removing a first part of said second portion of said first polycrystalline layer comprises removing said first part so as to penetrate to said second region of said substrate.

15. The method of claim 6 wherein said step of forming a dielectric isolation region between said first portion of said polycrystalline layer and said second part of said second portion of said first polycrystalline layer comprises forming said dielectric isolation region without a further masking operation.

16. A method for fabricating closely spaced contacts to a PN junction comprising:

providing a semiconductor substrate having therein a first region of a first conductivity type and a second region of a second conductivity type overlying said first region;

covering said second region with a first polycrystalline semiconductor layer;

covering said first polycrystalline layer with a first dielectric layer;

covering said first dielectric layer with a second polycrystalline layer;

covering said second polycrystalline layer with a first masking layer;

patterning said first masking layer to form an open region above a first portion of said second polycrystalline layer and a mask region above a second portion of said second polycrystalline layer;

doping first portions of said first and second polycrystalline layers with an etch rate reducing dopant through said open region of said masking layer leaving second portions of said first and second polycrystalline layers under said mask region substantially free of said etch reducing dopant;

removing a peripheral portion of said mask region to reduce its lateral extent by a predetermined amount;

removing a first part of said second portion of said second polycrystalline layer leaving a second part underneath said mask region;

then performing steps (a)–(c) in any order:

(a) removing the remaining part of said mask region;

(b) removing said second part of said second polycrystalline layer; and (c) removing a first part of said first dielectric layer underlying said first part of said second portion of said second polycrystalline layer;

thereafter performing steps (i)–(v) in any order:

(i) replacing a first part of said second portion of said first polycrystalline layer with a dielectric isolation region, leaving a second part of said second portion of said polycrystalline layer;

(ii) removing a second part of said first dielectric layer overlying said second part of said second portion of said first polycrystalline layer;

(iii) doping a first portion of said second region of said substrate underlying said dielectric isolation region; and (iv) doping said second part of said second portion of said first polycrystalline layer with said first conductivity type;

thereafter performing the following:

heating said substrate to drive the dopant provided in step (iv) above into a second portion of said second region of said substrate proximate to said first portion of said second region of said substrate;

providing first contact means for contacting said second part of said second portion of said first polycrystalline layer; and providing second contact means for contacting said first portion of said first polycrystalline layer.

17. The method of claim 16 wherein the step of doping with said etch rate reducing dopant comprises doping with a dopant of said second conductivity type.

18. The method of claim 16 wherein said step of removing a peripheral portion of said mask region comprises removing said peripheral portion without a further masking operation.

19. The method of claim 16 wherein said step of removing a first part of said second portion of said second polycrystalline layer comprises removing said first part without a further masking operation.

20. The method of claim 16 wherein said step of removing a first part of said second portion of said second polycrystalline layer comprises removing said first part by means of differential etching with an etchant that attacks said first portion of said second polycrystalline layer less rapidly than said second portion of said second polycrystalline layer.

21. The method of claim 16 wherein said step of replacing a first part of said second portion of said first polycrystalline layer comprises removing a first part of said second portion of said first polycrystalline layer and thereafter forming a dielectric isolation region between said first portion of said first polycrystalline layer and said second part of said second portion of said polycrystalline layer.

22. The method of claim 16 wherein said step of removing a second part of said first dielectric layer overlying said second part of said second portion of said first polycrystalline layer comprises removing part without a further masking operation.

23. The method of claim 16 wherein said step of doping a first portion of said second region of said substrate underlying said dielectric isolation region comprises doping said first portion without a further masking operation.

24. The method of claim 16 wherein said step of doping a first portion of said second region of said substrate underlying said dielectric isolation region comprises doping said first portion to a higher level of said second conductivity type.

25. The method of claim 16 wherein said step of doping said second part of said second portion of said first polycrystalline layer comprises doping said second part without a further masking operation.

26. The method of claim 16 wherein said step of doping said second part of said second portion of said first polycrystalline layer comprises doping with an impurity of said first conductivity type.

27. The method of claim 16 wherein said first covering step comprises covering said second region with a substantially undoped first polycrystalline semiconductor layer.

28. The method of claim 16 wherein said third covering step comprises covering said first dielectric layer with a substantially undoped second polycrystalline semiconductor layer.

29. The method of claim 21 wherein said step of removing a first part of said second portion of said first polycrystalline layer comprises removing said first part by means of differential etching with an etchant that attacks said first portion of said polycrystalline layer less rapidly than said second portion of said first polycrystalline layer.

30. The method of claim 21 wherein said step of removing a first part of said second portion of said first polycrystalline layer comprises removing said first part so as to penetrate to said second region of said substrate.

31. The method of claim 21 wherein said step of forming a dielectric isolation region between said first portion of said first polycrystalline layer and said second part of said second portion of said first polycrystalline layer comprises forming said dielectric isolation region without a further masking operation.

* * * * *